(12) United States Patent
Sun et al.

(10) Patent No.: US 11,740,264 B1
(45) Date of Patent: Aug. 29, 2023

(54) HIGH TEMPERATURE CURRENT SENSOR FOR POWER ELECTRONICS

(71) Applicants: Peng Sun, Fayetteville, AR (US); Zhong Chen, Fayetteville, AR (US)

(72) Inventors: Peng Sun, Fayetteville, AR (US); Zhong Chen, Fayetteville, AR (US)

( * ) Notice: Subject to any disclaimer, the term of this patent is extended or adjusted under 35 U.S.C. 154(b) by 0 days.

(21) Appl. No.: 17/590,919

(22) Filed: Feb. 2, 2022

Related U.S. Application Data

(60) Provisional application No. 63/146,192, filed on Feb. 5, 2021.

(51) Int. Cl.
*G01R 19/00* (2006.01)
*G01R 15/18* (2006.01)

(52) U.S. Cl.
CPC ....... *G01R 19/0092* (2013.01); *G01R 15/181* (2013.01)

(58) Field of Classification Search
CPC .......................... G01R 19/0092; G01R 15/181
USPC ................ 324/142, 522, 127, 547, 654, 529
See application file for complete search history.

(56) References Cited

U.S. PATENT DOCUMENTS

| | | | | |
|---|---|---|---|---|
| 6,439,056 | B1 * | 8/2002 | Jonsson | G01L 9/0075 73/708 |
| 9,958,480 | B2 * | 5/2018 | Nejatali | H04B 5/0081 |
| 10,656,186 | B2 * | 5/2020 | Kashiwaya | G01R 15/181 |
| 2009/0021212 | A1 * | 1/2009 | Hasegawa | H01F 27/2885 320/108 |

FOREIGN PATENT DOCUMENTS

| | | | | |
|---|---|---|---|---|
| CN | 113341199 A | * | 9/2021 | |
| EP | 3715867 A1 | * | 9/2020 | ............. G01R 15/12 |

OTHER PUBLICATIONS

Sheng Kuang, Guo Qing, Zhang Junming, and Qian Zhaoming, "Development and Prospect of SiC Power Devices in Power Grid," Proceedings of the CSEE, vol. 32, No. 30, pp. 1-7, Oct. 2012.
Wang Xuemei, "Researches and Applications of Wide Bandgap SiC Power Devices in Electric Vehicles," Proceedings of the CSEE, vol. 34, No. 3, pp. 371-379, Jan. 2014.
Xiao, Chucheng, et al. "An overview of integratable current sensor technologies." 38th IAS Annual Meeting on Conference Record of the Industry Applications Conference, 2003.. vol. 2. IEEE, 2003.
Hasegawa, Kazunori, et al. "A new output current measurement method with tiny PCB sensors capable of being embedded in an IGBT module." IEEE Transactions on Power Electronics 32.3 (2016): 1707-1712.
Liu, Pengkun, et al. "High bandwidth current sensing of SiC MOSFET with a Si current mirror." 2016 IEEE 4th Workshop on Wide Bandgap Power Devices and Applications (WiPDA). IEEE, 2016.

(Continued)

*Primary Examiner* — Tung X Nguyen
*Assistant Examiner* — Robert P Alejnikov, Jr.
(74) *Attorney, Agent, or Firm* — Keisling & Pieper PLC; David B. Pieper; Trent C. Keisling

(57) ABSTRACT

An enclosed low temperature cofired ceramic current sensor with planar signal pads incorporating shield plates protecting an inner positioned circumference offset herringbone wound coil connected to a pair of bottom signal pads, and a central axis stacked power conductor connected to a pair of bottom power pads outside of the top and bottom shield plates.

11 Claims, 10 Drawing Sheets

(56) References Cited

OTHER PUBLICATIONS

Wang, Gangyao, et al. "Dynamic and static behavior of packaged silicon carbide MOSFETs in paralleled applications." 2014 IEEE Applied Power Electronics Conference and Exposition-APEC 2014. IEEE, 2014.

Spang, Matthias, and Niklas Hofstoetter. "Evaluation of current measurement accuracy for a power module with integrated shunt resistors." PCIM Europe 2017; International Exhibition and Conference for Power Electronics, Intelligent Motion, Renewable Energy and Energy Management. VDE, 2017.

Naumann, Falk, et al. "Mechanical and microstructural characterization of LTCC and HTCC ceramics for high temperature and harsh environment application." CIPS 2020; 11th International Conference on Integrated Power Electronics Systems. VDE, 2020.

Wang, H. M., et al. "Analysis of the thermal expansion effect on measurement precision of Rogowski coils." 2005 International Conference on Power Electronics and Drives Systems. vol. 2. IEEE, 2005.

Jiao, Chaoqun, et al. "Research on Small Square PCB Rogowski Coil Measuring Transient Current in the Power Electronics Devices." Sensors 19.19 (2019): 4176.

\* cited by examiner

Fig. 1 Schematic of the current sensor

*Fig. 2 Overview of the current sensor*

Fig. 4 Bottom view of the current sensor

Fig. 5 Inner connection of the current sensor with shield layers

Fig. 6 Inner connection of the current sensor concealing shield layers

HIGH TEMPERATURE CURRENT SENSOR FOR POWER ELECTRONICS

CROSS-REFERENCE TO RELATED APPLICATIONS

This application claims priority to and is a continuation-in-part of U.S. Patent Application Ser. No. 63/146,192, filed on Feb. 5, 2021 entitled High Temperature Current Sensor for Power Electronics which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in a high temperature current sensor for power electronics. More particularly, the invention relates to improvements particularly suited for providing the capability to measure current at higher temperature than traditional integrated current measurement method, that is ready to be integrated in power module with surface mount package design, and has very limited impact on the switching performance of the power module parasitic inductance n the proposed current sensor. In particular the present invention relates specifically to a low temperature cofired ceramic current sensor with a top and bottom shielded circumference offset herringbone wound coil connected to a pair of bottom signal pads and a pair of bottom power pads connected outside of the plate shielding to a central axis stacked power conductor.

2. Description of the Known Art.

As will be appreciated by those skilled in the art, current sensors are known in various forms. Patents disclosing information relevant to current sensors include: United States Pat. No. 10,656,186, issued to Kashiwaya on May 19, 2020 entitled Heat-resistant device for current detection. This patent is hereby expressly incorporated by reference in its entirety.

Also for consideration is that recently, with the development of PCB Rogowski coils, they can meet the dimension requirements of measuring current in the power module. The PCB Rogowski coil can measure current without causing additional power loss and isolation problems. However, due to the poor electrical and mechanical performance at high temperature and large CTE of PCB substrate, the parameters of Rogowski coil based on PCB technology are not stable at high temperature power. Therefore, it is not suitable to be integrated directly into high temperature power modules, (e.g., high-temperature SiC modules). In addition, the assembling method of PCB Rogowski coil has not been particularly designed for integration.

Other articles that may considered include:

[1] SHENG Kuang, GUO Qing, ZHANG Riming, and QIAN Zhaoming, "Development and Prospect of SiC PowerDevices in Power Grid," Proceedings of the CSEE, Vol. 32, No. 30, pp. 1-7 Oct. 2012.

[2] WANG Xuemei, "Researches and Applications of Wide Bandgap SiC Power Devices in Electric Vehicles," Proceedings of the CSEE, Vol. 34, No. 3, pp. 371-379, Jan. 2014.

[3] XIAO, Chucheng, et al. "An overview of integratable current sensor technologies." 38th IAS Annual Meeting on Conference Record of the Industry Applications Conference, 2003. Vol. 2. IEEE, 2003.

[4] Hasegawa, Kazunori, et al. "A new output current measurement method with tiny PCB sensors capable of being embedded in an IGBT module." IEEE Transactions on Power Electronics 32.3 (2016): 1707-1712.

[5] Liu, Pengkun, et al. "High bandwidth current sensing of SiC MOSFET with a Si current mirror." 2016 IEEE 4th Workshop on Wide Bandgap PowerDevices and Applications (WiPDA). IEEE, 2016.

[6] Wang, Gangyao, et al. "Dynamic and static behavior of packaged slicon carbide MOSFETs in paralleled applications." 2014 IEEE Applied Power Electronics Conference and Exposition-APEC 2014. IEEE, 2014.

[7] Spang Matthias, and Niklas Hofstoetter. "Evaluation of current measurement accuracy for a power module with integrated shunt resistors." PCIM Europe 2017; International Exhibition and Conference for Power Electronics, Intelligent Motion, Renewable Energy and Energy Management. VDE, 2017.

[8] Naumann, Falk, et al. "Mechanical and microstructural characterization of LTCC and HTCC ceramics for high temperature and harsh environment application." CIPS 2020; 11th International Conference on Integrated Power Electronics Systems. VDE, 2020.

[9] Wang, H. M., et al. "Analysis of the thermal expansion effect on measurement precision of Rogowski coils" 2005 International Conference on Power Electronics and Drives Systems. Vol. 2. IEEE, 2005.

Jiao, Chaoqun, et al. "Research on Small Square PCB Rogowski Coil Measuring Transient Current in the Power Electronics Devices." Sensors 19.19 (2019): 4176.

With the advances of electric vehicles smart grids, aerospace and other industries, the market and development prospects of power electronic modules are increasing. At the same time, more requirements have been put forward to the power modules. Traditional silicon power modules require complicated thermal management with large cooling system, which reduces the overall efficiency, power density, and cost of overall system. Currently, power chips based on new-generation semiconductor materials such as silicon carbide (SiC) and gallium nitride (GaN) are rapidly developing. The superior characteristics of the new material, such as wide bandgap, high thermal conductivity, and high carrier saturation, enable the new generation of power chips to work at higher temperatures and harsh environment Intelligent power modules are developing with various sensors, such as current sensors, integrated within the power modules. The current sensor integrated in the module can be used to monitor the operating status of power module, protect the module and perform feedback control, which can greatly improve the operating safety, reliability and efficiency. However, in order to make the entire module work at high temperature, the integrated current sensor need to be operated stably and accurately in high temperature applications. At present, three methods (i.e., current shunt, semiconductor current mirror and printed circuit board (PCB) Rogowski coil) are mainly adopted to measure current in commercial power nodules. Since the shunt resistor is directly inserted in the power circuit, the power loss generated from the resistor will reduce the efficiency of the module and introduce more isolation problems. Furthermore, the coaxial resistance shunt is too bulky to be integrated inside the power packages. The parasitic inductance and skin effect of the plate-type shunt resistor will greatly affect the accuracy of current measuring at high-frequency. Therefore, the current shunt resistor is not suitable in wide bandgap semiconductor modules with high switching frequency. For the semiconductor current mirror, the parameter variations of the sensing device and switching device can be an issue. For example, the on-state resistance of SiC MOSFET could be changed from device to device with more than 15% variations. Therefore, the accuracy and consistency of the semiconductor current mirror sensors are difficult to be guaranteed. Moreover, the characteristics of semiconductor devices such as power MOSFETs are largely affected by the temperature. It is more difficult for the semiconductor current mirror o obtain accurate current measurement results at high temperatures. PCB Rogowski coil has better current measurement performance at relatively high switching frequency, but the substrate material is usually based on epoxy resin. The mechanical and isolating performance will become less satisfactory at high temperaure (e.g., over 200☐). Due to large coefficient of thermal expansion (CTE) of the substrate material, the deformation of the coil at high temperature can happen, which can change the parameters of the Rogowski coil sensor. As a result, the current measurement accuracy with PCB Rogowski coil at high temperature is also limited. In addition, the existing PCB Rogowski coil for measuring chip current are designed to connect with the bonding wires. No mechanical fastening is designed for the coil integration. Therefore, the integration of the current sensor in the power modules need to be considered in high temperature current sensor design.

Thus, in the power module, in order to monitor the operation status and facilitate the control and protection of the module, a current sensor is usually integrated inside the module. With the rapid development of wide-bandgap power semiconductors, the operating temperature range of power chips has been significantly enhanced. In order to reduce the size of the heat dissipation elements and increase the power density of the system, power modules are also developing in the direction of high-temperature operation However, the current sensor integrated in the module usually has issues, such as large power loss and low bandwidth. The PCB Rogovvski coil is considered to have great potential to be integrated in the module as a sensing element for monitoring current. However, due to the poor high-temperature characteristics of the PCB-based Rogowski coil and the test error, it is also not good for monitoring current in the integrated high-temperature power modules.

From these prior references it may be seen that these prior art patents are very limited in their teaching and utilization, and an improved current sensor is needed to overcome these limitations:

SUMMARY OF THE INVENTION

The present invention is directed to an improved novel current sensor based on low temperature co-fired ceramic (LTCC) substrate and Rogowski coil methodology including shielding and planar pad connections that can be integrated conveniently in power module to measure current at high temperature.

The present invention is a novel current sensor, which based on the LTCC technique and Rogowski coil methodology with shielding and planar contacts. In this manner, the present current sensor is able to withstand high temperature and ready to be integrated in the power modules. The coil parameters will not be changed significantly at high temperatures due to the small coefficient of thermal expansion and the integration of the power loop into the design so that all of the CTE's are consistent. In this manner, it is highly suitable to be integrated as a current sensor in high temperature power modules.

Advantages of the present invention are that this current sensor is easy to be integrated in the power module and has very limited impact on the switching characteristics of the power module. With good high temperature stability, the proposed current sensor is very suitable for continuously monitoring the current in the high temperature power module.

The present invention has applications in high-power high-temperature SiC power modules, photovoltaic inverters, solid-state transformers, electric vehicles, aerospace inverters, electric traction, pulse power supplies and motor drives.

These and other objects and advantages of the present invention along with features of novelty appurtenant thereto, will appear or become apparent by reviewing the following detailed description of the invention.

BRIEF DESCRIPTION OF THE SEVERAL VIEWS OF THE DRAWINGS

In the following drawings which form a-part of the specification and which are to be construed in conjunction therewith, and in which like reference numerals have been employed throughout wherever possible to indicate like parts in the various views.

DETAILED DESCRIPTION OF THE INVENTION

Figure 1:
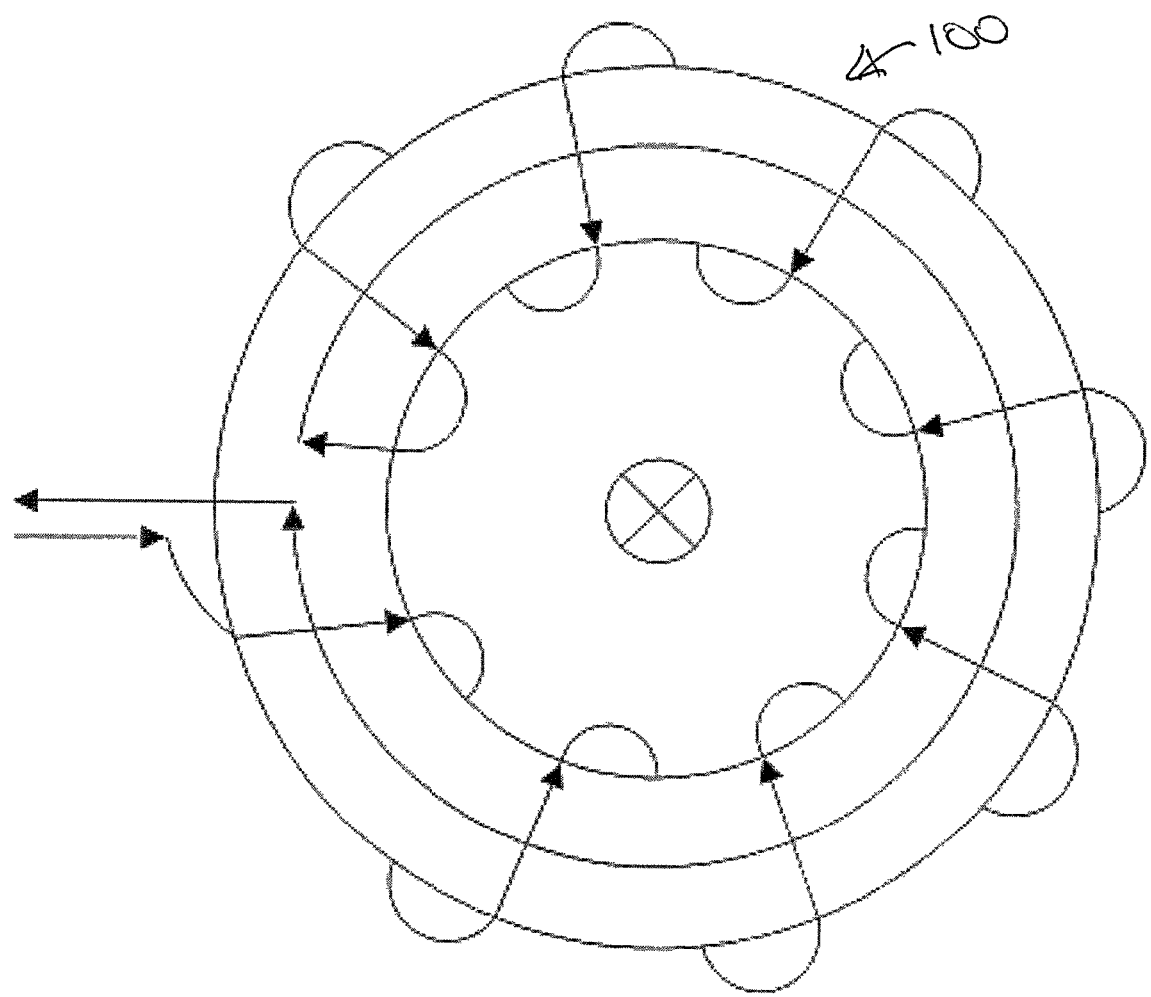
FIG. 1 shows the schematic of the electrical paths for the Rogo ski coil of the present invention.

As shown in FIG. 1 through 10 of the drawings, one exemplary embodiment of the present invention is generally shown as a current sensor 100. Main elements of the current sensor 100 are shown as the planar pad connections 200, shielding 300, sensing coil 400, power trunk 500 which are implanted in an LTCC layer stack 600.

The current sensor 100 is built with planar pad connections 200 including both bottom signal pads 210 and bottom power pads 250 positioned on opposite corners of a square shaped layer stack 600. The bottom signal pads 210 include a first signal pad 211 and second signal pad 212. The first signal pad 211 is connected to a bottom shield bypass mid coil connection 220 and the second signal pad 212 is connected to the coil end connection 230 that is also connected to the bottom shield 310. The bottom power pads 250 include a first power pad 251 and a second power pad 252. The first power pad 251 is connected to the center offset bottom power connection 260 with a center offset limb 262, and the second power pad 252 is connected to the side bypass power connection 270.

The shielding 300 is implanted with two planar shields including a bottom shield 310 and a top shield 320 connected to each other by two vertical shield connections 330.

The sensing coil 400 is electrically connected to the bottom signal pads 210 and is made with bottom radial coil connections 410, vertical coil connections 420 including an inner coil trunk connection 421 and an outer coil trunk connection 422, and top circumference offset herringbone coil connections 430. The top circumference offset herringbone coil connections 430 includes an outer perpendicular extension 431 connected to an outer angled extension 432 to a circumferential step 433 to an inner angled extension 434 to an inner perpendicular extension 435 extension 433. The outer perpendicular extension 431 and the inner perpendicular extension allows for the coil to remain perpendicular to the power trunk 500 for as long as possible to improve the sensing ability of the coil 400.

The ends of the sensing coil 400 are connected at the mid output offset connection 440 and the end output offset connection 450.

The power trunk 500 uses a central axis stacked power conductor 510 connected to the center offset bottom power connection 260 and a center offset upper power connection 520 including a center offset limb 522 connected to the side bypass power connection 270 including one or more vertical power trunks.

The main elements of the current sensor 100 including the planar pad connections 200, shielding 300, sensing coil 400, power trunk 500 are implanted within the LTCC layer stack 600 to make an enclosed package. The layer stack 600 is formed from nine different types of layers shown from top to bottom as the as the upper insulating layer 610, upper power offset layer 620, upper shield layer 630, upper circumference offset herringbone coil connection layer 640, vertical connection layer 650, mid connection layer 660, bottom radial coil connection layer 670, bottom shield layer 680, and bottom pad connection layer 690.

In this construction, the current sensor 100 can be used with a high temperature power module that has lower cooling requirements and increases the efficiency and power density of the power electronics equipment. In this manner, this invention provides a novel method of design and fabrication of high temperature Rogowski coils and their implementation into power nodules.

SiC power devices can safely transfer the power up to 250° C. In order to make this current sensor 100 able to be integrated into power modules and work at high temperature, the Rogowski coil need to have a stable high temperature characteristics, small coefficient for thermal expansion (CTE), a convenient and reliable connection with direct bond copper (DBC) substrate. The low temperature cofired ceramics (LTCCs) provided the platform for use with high temperature power electronics. The mechanical and electrical characteristics of LTCC are stable under high temperature up to 500° C. The CTE of LTCC is much smaller than that of the PCB such that the LTCC based current sensor 100 is be more stable in wide temperature range. In addition, due to the CTE of LTCC is similar to that of DBC, the thermal stress on the solder between the pads of LTCC current sensor 100 and DBC is quite small under different temperatures. In addition, the thermal stress is one of the main factors that cause solder failure. Therefore, the soldering reliability improves a lot using LTCC as the current sensor 100 base. In order to conveniently integrate the LTCC based Rogowski coil into the power modules, the four planar pad connections 200 are placed on the bottom of the LTCC device. The current sensor 100 can be directly soldered on the DBC with these pads 200. Two of them are the signal pads 210, which are connected inside the current sensor 100. The inner connection is built as an evenly wound coil 400 which looks like a ring solenoid. The circumference offset herringbone winding is returned to the starting point along the central axis of the wound coil 400. The circumference offset herringbone winding and two shield layers are designed to maximize the available signal and protect the signal from interference. The other two pads are power pads and the pads are also connected inside the device. The measured current flows into and out of the device through the power pads. The power loop crosses the inner signal coil, so the current can be sensed by the signal coil through electromagnetic induction. In order to reduce the parasitic inductance of the power loop induced by current sensor 100, the power pads are designed to be close to each other and the connection loop is reduced as small as possible.

As shown in the preferred embodiment, the proposed current sensor 100 is based on the methodology of the Rogowski coil. The schematic figure of the embodiment's Rogowski coil is shown in FIG. 1.

Figure 2:
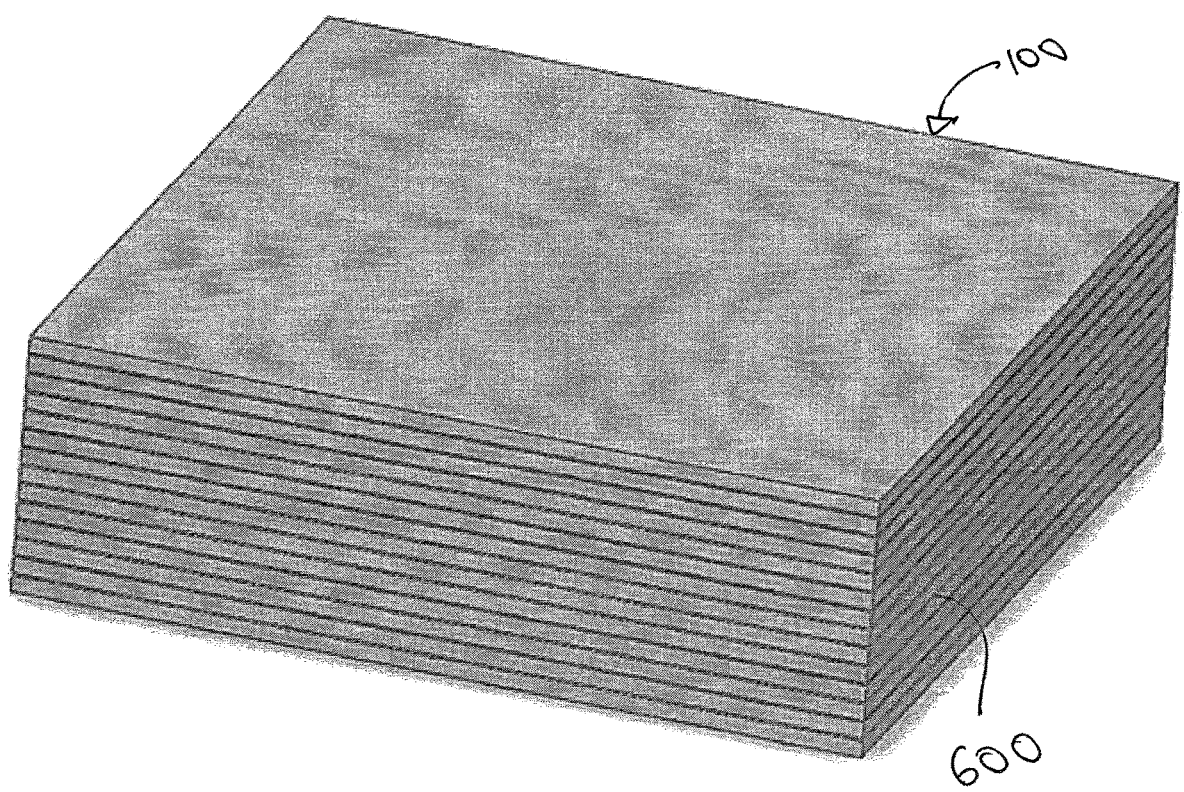
FIG. 2 shows the LTCC stack for the present invention.
Figure 5:
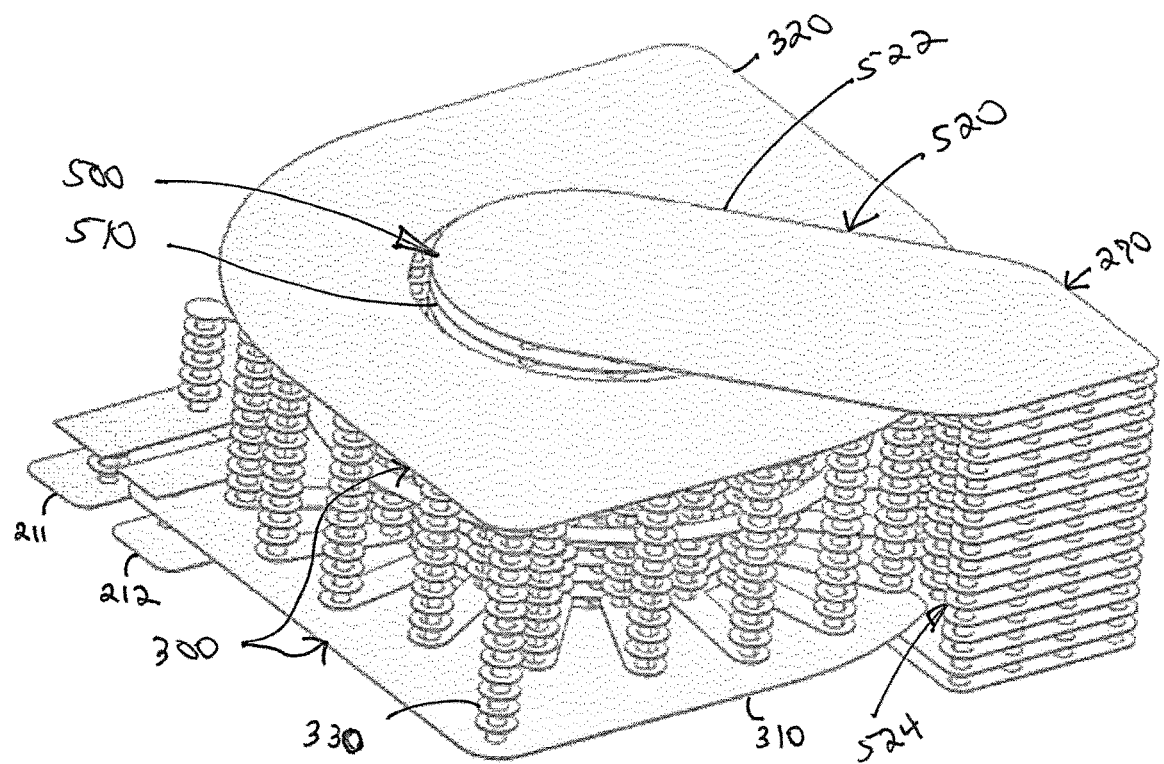
FIG. 5 is a schematic view of the inner connection of the current sensor with shield layers.
Figure 6:
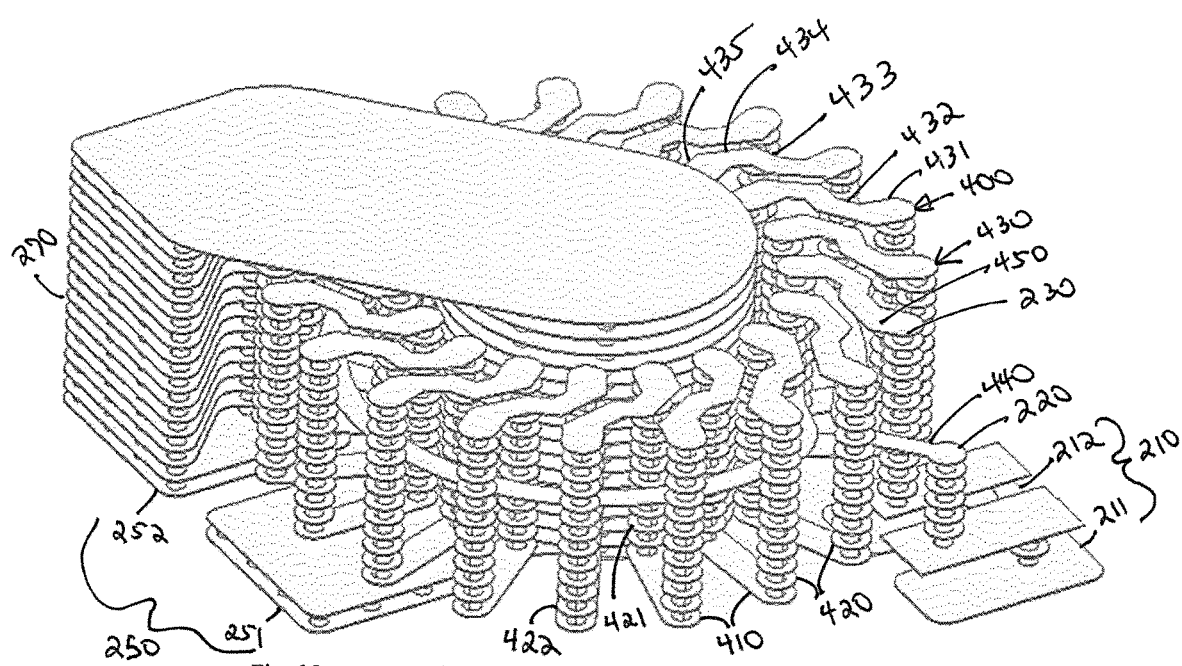
FIG. 6 is a schematic view of the inner connection of the current sensor with the shielding layers concealed to understand the circumference offset herringbone pattern for the Rogowski coil.
Figure 7:
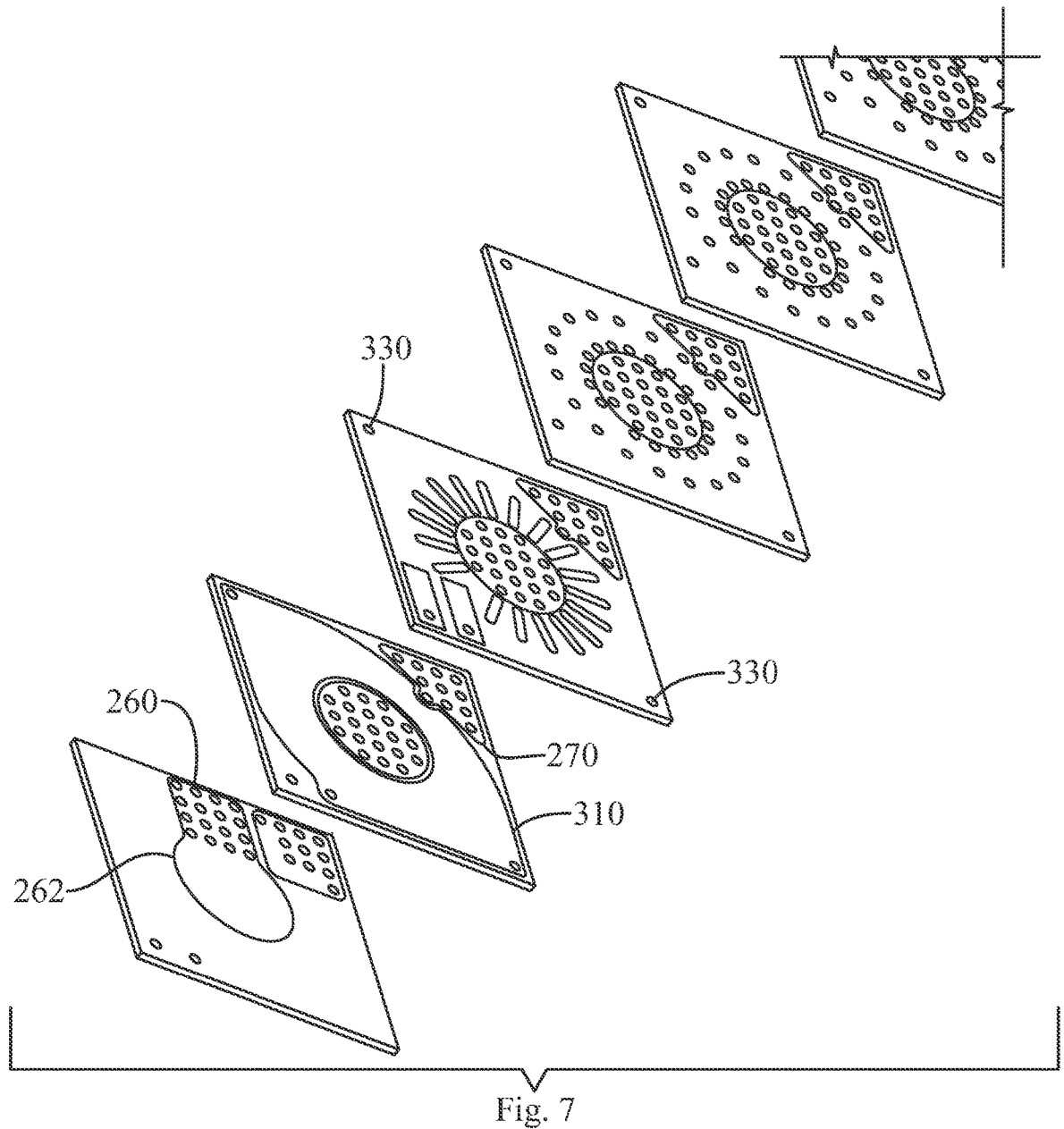
FIG. 7 shows layers 1 through 5 of the LTCC stack of the current sensor.
Figure 8:
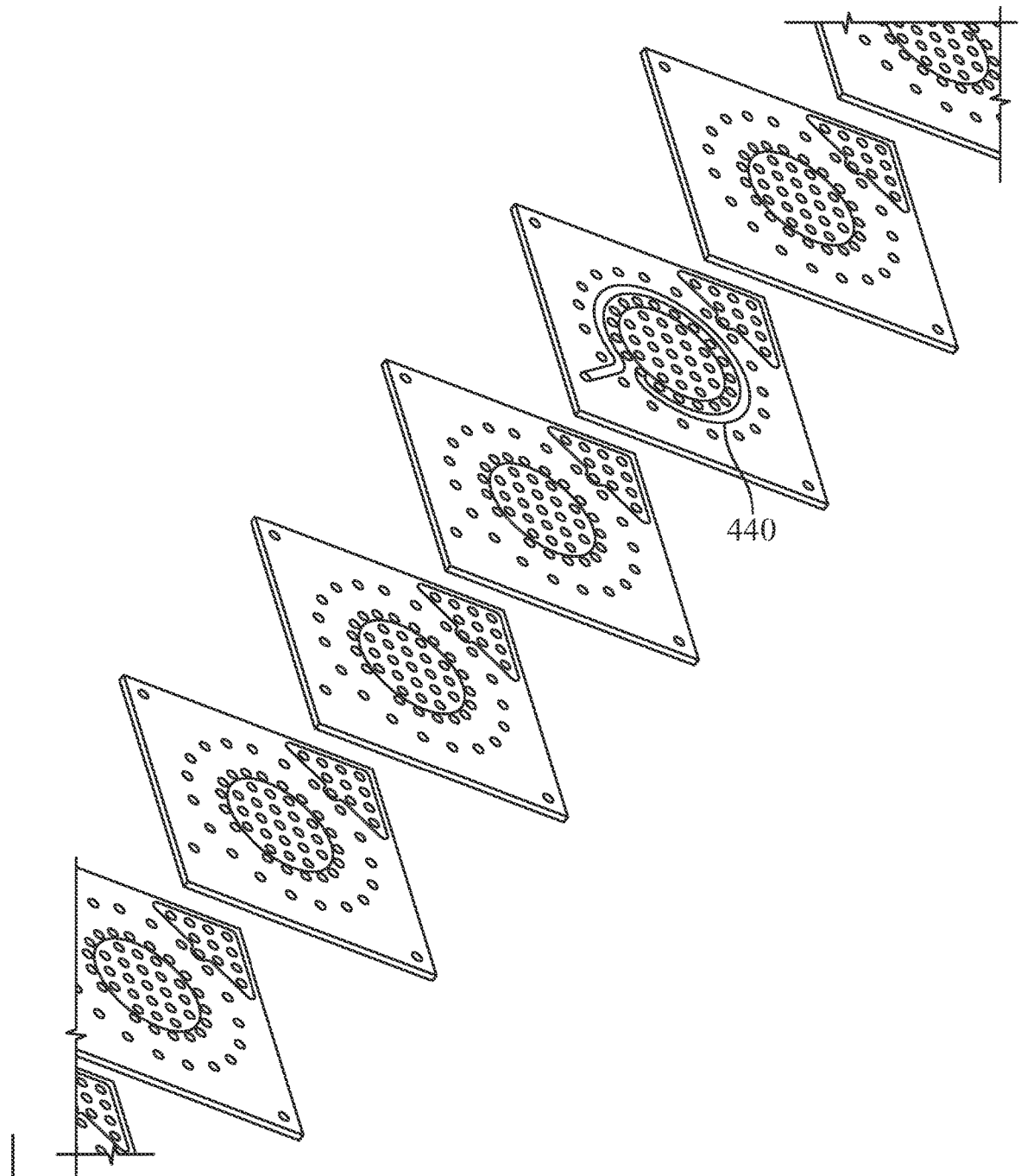
FIG. 8 shows layers 6 through 10 of the LTCC stack of the current sensor.
Figure 9:
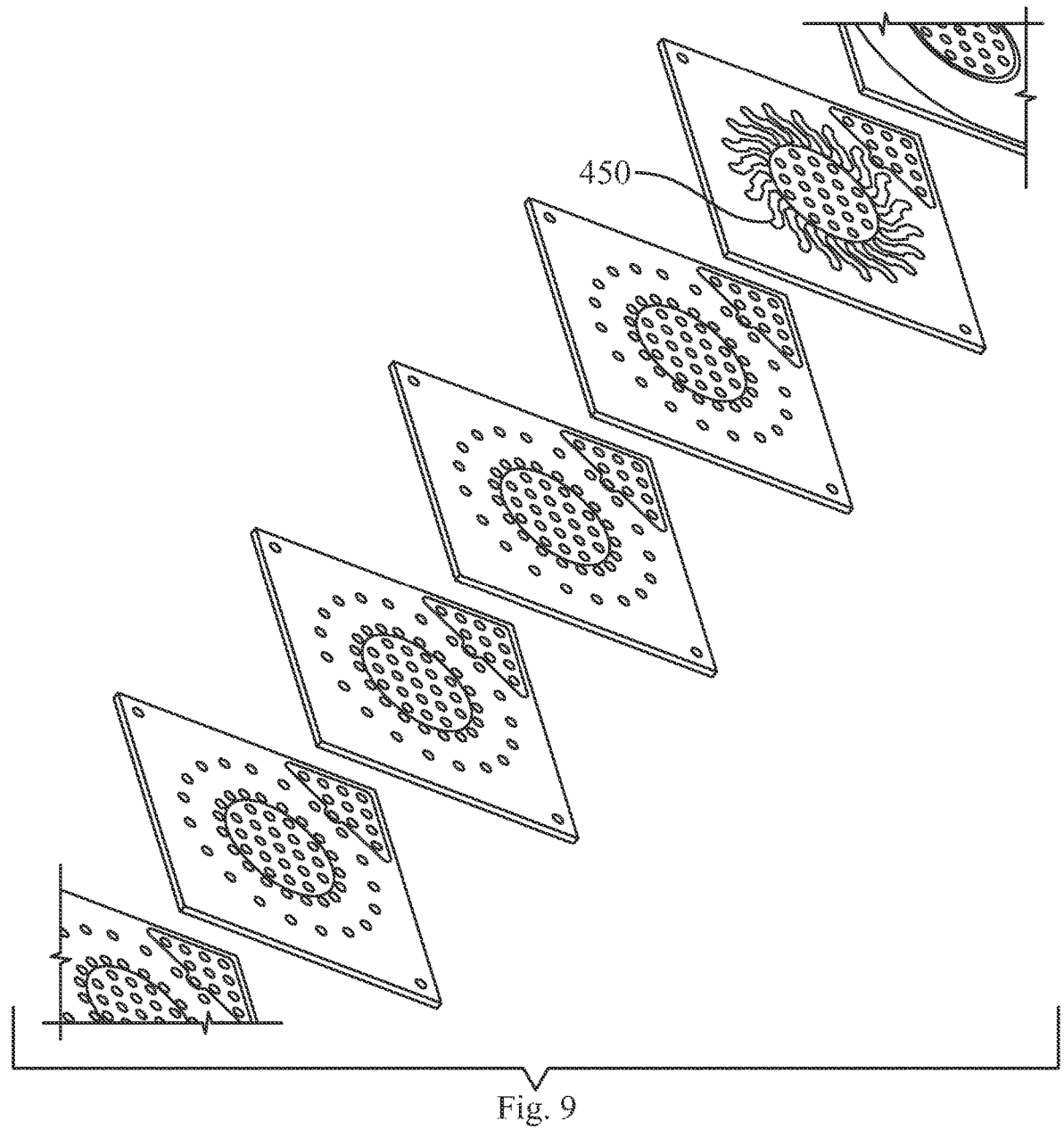
FIG. 9 shows layers 11 through 15 of the LTCC stack of the current sensor.
Figure 10:
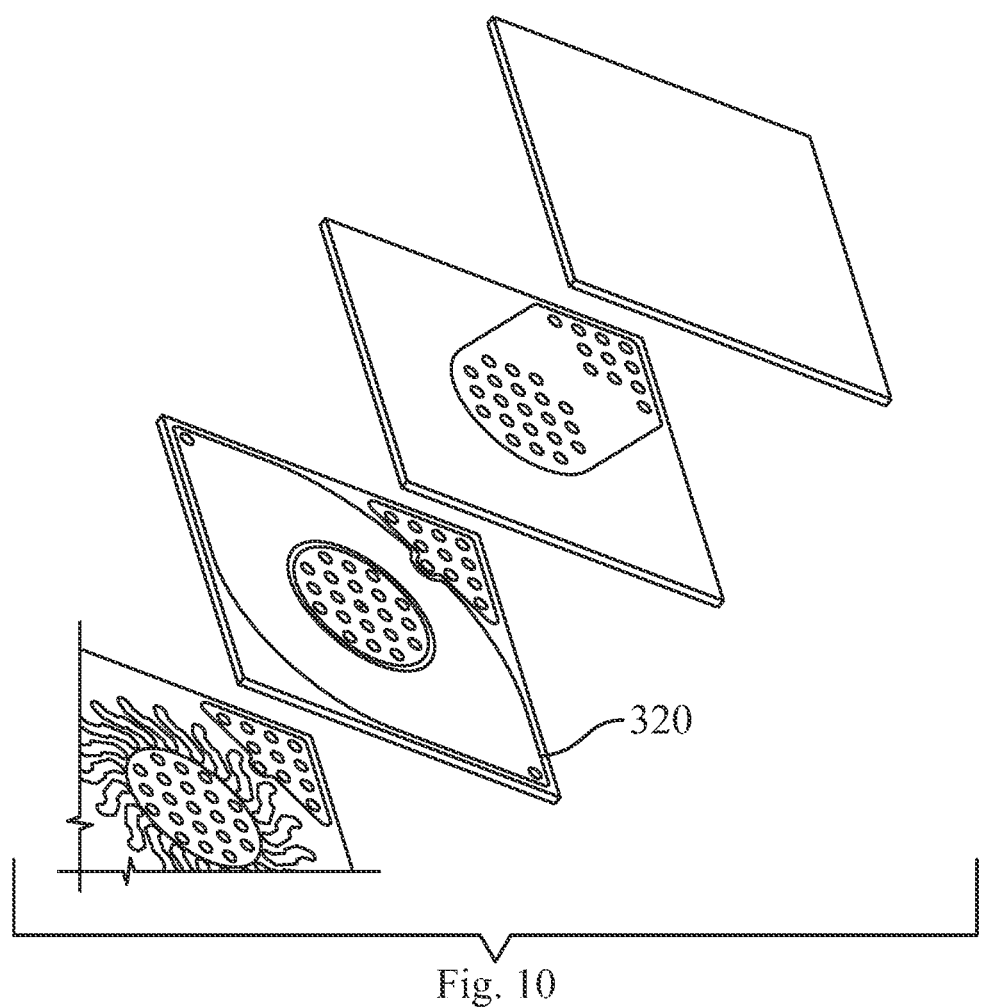
FIG. 10 shows layers 16 through 18 of the LTCC stack of the current sensor.

A detailed design of the current sensor 100 is shown in FIG. 5 and FIG. 6. FIG. 2 shows the outside of the package of the current sensor 100. The size of the current sensor 100 is 10.1 mm*10.3 mm*3.6 mm. The low profile of the current sensor 100 makes it suitable to be integrated in power modules.

Figure 3:
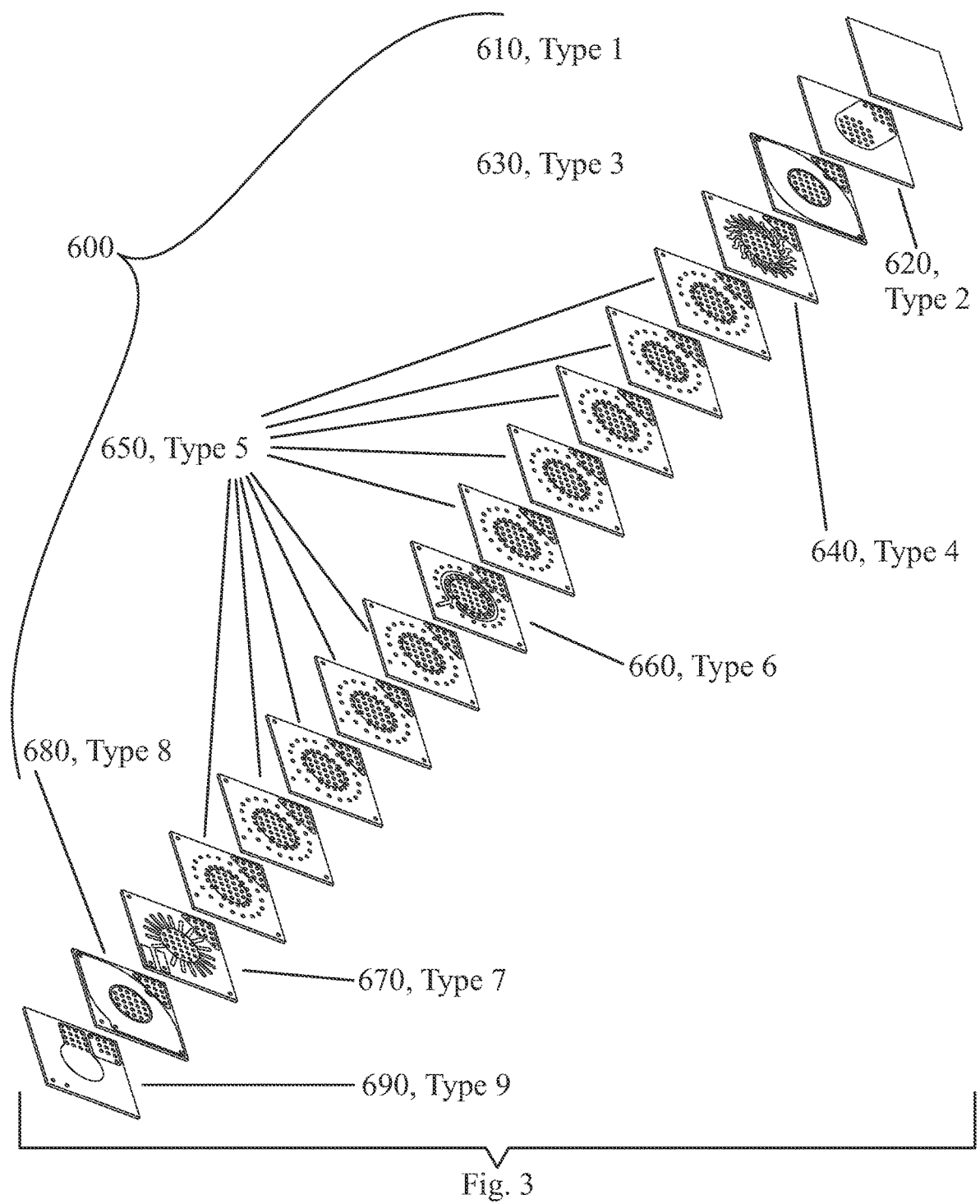
FIG. 3 is an exploded view of the current sensor.

The exploded view of the current sensor 100 is shown in FIG. 3. The LTCC current sensor 100 is stacked with different layers of tapes. All the types could be classified as nine different types. Type 1 layer is the top lid 610 of the current sensor 100, which is used to cover the sensor and protect the inner connection. Type 2 layer is the top power connecting layer 620, which is used to connect from the outside to the inside. Type 3 and type 8 layers are the top shield layer 630 and bottom shield layer 680, respectively. The two shield layers 630, 680 are connected with each other by grounded vias, which are used to protect the signal from being disturbed by ambient noise. Type 4 layer is the top signal connecting layer 640, which is used to build the connection on the top of the signal loop. Type 5 layers are vertical connection layers 650, which are used to connect the power loop and signal loop from top to bottom. Type 6 layer is the central returning layer 660, which is used to return the signal winding wire from to the starting point along the central axis of the ring solenoid wound coil. Type 7 layer is the bottom signal connecting layer 670, which is used to connect the signal traces on the bottom of the signal loop. Moreover, the connecting direction of the type 4 and type 7 layers 640, 670 are different, so the entire signal loop could be a spiral shape. Type 9 layer is bottom base layer 690, which is used to connect the power connection on the bottom. Additionally, in order to make the current sensor 100 more convenient to be assembled on DBC, the signal and power terminals are connected to the four pads 210, 250 on the back of the bottom base layer. The distance of the power pads 250 is set as close as possible so that the soldering is feasible.

Additionally, in order to make the current sensor 100 more convenient to be assembled on DBC, the signal and power terminals are connected to the four pads 210, 250 on the back of the bottom base layer. The distance of the power pads 250 is set as close as possible so that the soldering is feasible.

Figure 4:
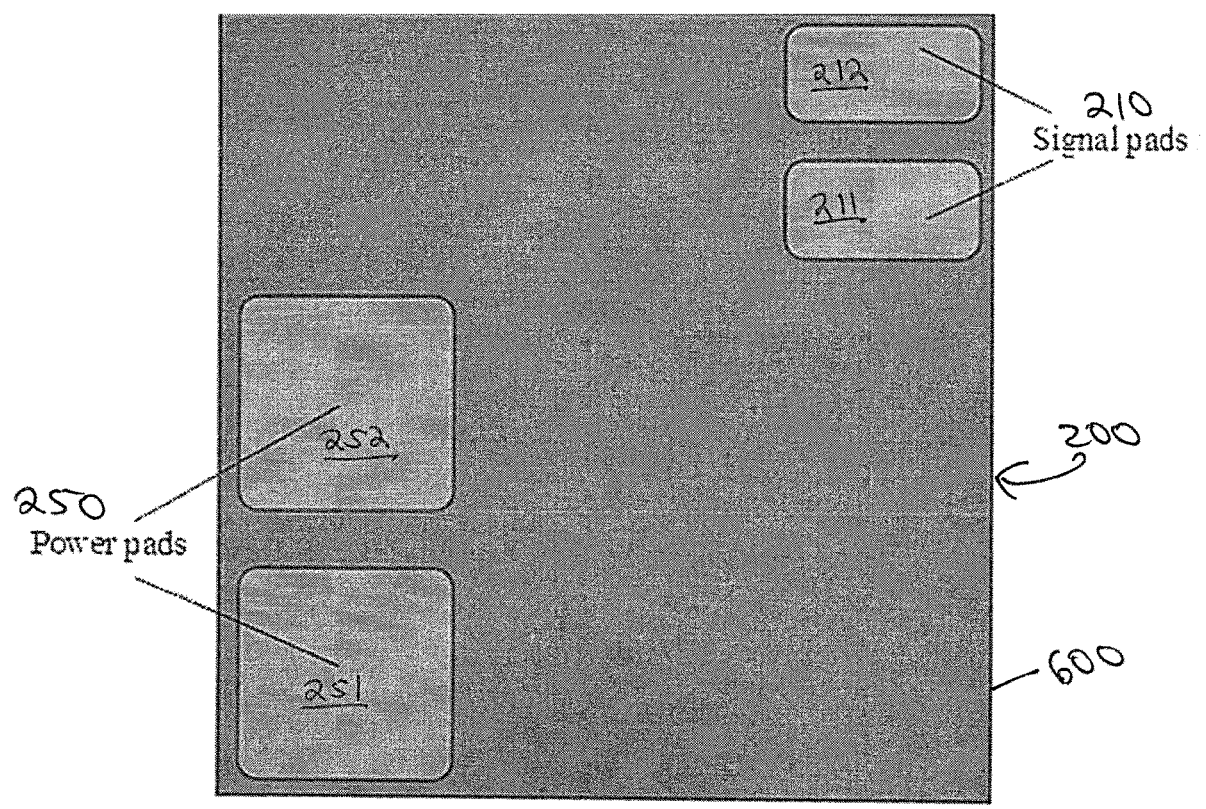
FIG. 4 is a bottom view of the current sensor.

The bottom view of the current sensor 100 is shown in FIG. 4. Two signal pads 210 and two power pads 250 are on the back of the sensor 100. All of the four pads 210, 250 are solderable so that the current sensor 100 could be soldered on the DBC or PCB conveniently.

As shown in FIG. 5 and FIG. 6, the inner connection 3D model of the current sensor 100 has been built with modeling software. The simulation results show that the mutual inductance between the power loop and signal loop is 3.83 nH at 10 MHz. The parasitic inductance of power loop and signal loop are 2.14 nH and 106.73 nH respectively at 10MHz.

Reference numerals used throughout the detailed description and the drawings correspond to the following elements:
current sensor 100
planar pad connections 200
   bottom signal pads 210
   first signal pad 211
   second signal pad 212
   bottom shield bypass mid coil connection 220
   bottom shield bypass coil end connection 230
   bottom power pads, 250
   first power pad 251
   second power pad 252
   center offset bottom power connection 260
   center offset limb 262
   side bypass power connection 270
shielding 300
   bottom shield 310
   top shield 320
   vertical shield connections 330
sensing coil 400
   bottom radial coil connections 410
   vertical coil connections 420
   inner coil trunk connection 421
   outer coil trunk connection 422
   top circumference offset herringbone coil connections 430
   mid output offset connection 440
   end output offset connection 450
power trunk 500
   central axis stacked power conductor 510
   center offset upper power connection 520
   center offset limb 522
   shield bypass trunk 524
layer stack 600
   upper insulating layer 610
   upper power offset layer 620 upper shield layer 630
   upper circumference offset herringbone coil connection layer 640
   vertical connection layer 650
   mid connection layer 660
   bottom radial coil connection layer 670
   bottom shield layer 680
   bottom pad connection layer 690

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "first" element of the equivalent thereof, such claims should be understood to include incorporation of one or more such elements neither requiring nor excluding two or more such elements.

What is claimed is:

1. A surface mount current sensor comprising:
   a low temperature cofired ceramic including a bottom with bottom signal pads and bottom power pads,
   the low temperature cofired ceramic incorporating a top shield plate and a bottom shield plate sandwiching an inner positioned circumference offset herringbone wound coil,
   the inner positioned circumference offset herringbone wound coil connected to the bottom signal pads, and
   a central axis stacked power conductor extending through the bottom shield plate, the herringbone wound coil, and the top shield plate,
   the central axis stacked power conductor connected to the bottom power pads outside of the top and bottom shield plates.

2. The surface mount current sensor of claim 1, further comprising:
   the bottom signal pads and bottom power pads positioned in a single plane to form planar pad connections.

3. The surface mount current sensor of claim 1, further comprising:
   the bottom signal pads including a first signal pad and a second signal pad; and
   a bottom shield bypass mid coil connection connecting the inner positioned circumference offset herringbone wound coil to the first bottom signal pad.

4. The surface mount current sensor of claim 1, further comprising:
   the bottom signal pads including a first signal pad and a second signal pad; and
   a bottom shield bypass coil end connection connecting the inner positioned circumference offset herringbone wound coil to the second bottom signal pad.

5. The surface mount current sensor of claim 1, further comprising:
the bottom power pads including a first power pad and a second power pad; and
a center offset bottom power connection connecting a center offset limb to the first power pad and the central axis stacked power conductor.

6. The surface mount current sensor of claim 5, further comprising:
the bottom power pads including a first power pad and a second power pad; and
a side bypass power connection connected to the second power pad.

7. The surface mount current sensor of claim 6, further comprising:
a center offset upper power connection connecting the side bypass power connection to the central axis stacked power conductor.

8. The surface mount current sensor of claim 1, further comprising:
the top shield plate and bottom shield plate connected by vertical shield connections.

9. A surface mount current sensor comprising:
a low temperature cofired ceramic layer stack including an upper insulating layer;
an upper power offset layer below the upper insulating layer;
an upper shield layer below the upper power offset layer;
an upper circumference offset herringbone coil connection layer below the upper shield layer;
a vertical connection layer below the upper circumference offset herringbone coil connection layer;
a mid connection layer below the vertical connection layer;
a bottom radial coil connection layer below the mid connection layer;
a bottom shield layer below the bottom radial coil connection layer; and
a bottom pad connection layer bottom shield layer.

10. The surface mount current sensor of claim 1, further comprising:
the inner positioned circumference offset herringbone wound coil including bottom radial coil connections connected through vertical coil connections to top circumference offset herringbone coil connections.

11. The surface mount current sensor of claim 1, further comprising:
the vertical coil connections including both an inner coil trunk connection and an outer coil trunk connection; and
a mid output offset connection positioned between the inner coil trunk connection and the outer coil trunk connection.

* * * * *